United States Patent
Sun

(10) Patent No.: US 8,853,676 B2
(45) Date of Patent: Oct. 7, 2014

(54) ORGANIC LIGHT EMITTING DIODE AND MANUFACTURING METHOD THEREOF

(75) Inventor: Li Sun, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 805 days.

(21) Appl. No.: 12/628,870

(22) Filed: Dec. 1, 2009

(65) Prior Publication Data
US 2010/0181557 A1 Jul. 22, 2010

(30) Foreign Application Priority Data
Jan. 20, 2009 (CN) .......................... 2009 1 0076775

(51) Int. Cl.
*H01L 29/08* (2006.01)
*H01L 51/52* (2006.01)

(52) U.S. Cl.
CPC .................................. *H01L 51/5234* (2013.01)
USPC ....................... 257/40; 313/505; 257/E51.024

(58) Field of Classification Search
USPC ............................................ 313/505; 257/40
See application file for complete search history.

(56) References Cited

U.S. PATENT DOCUMENTS

| | | | | |
|---|---|---|---|---|
| 5,739,545 | A * | 4/1998 | Guha et al. | 257/40 |
| 6,743,524 | B2 * | 6/2004 | Schaepkens | 428/689 |
| 7,291,973 | B2 * | 11/2007 | Ishihara et al. | 313/505 |
| 7,368,659 | B2 * | 5/2008 | Heller | 136/263 |
| 7,733,011 | B2 * | 6/2010 | Cina et al. | 313/504 |
| 2004/0000863 | A1 * | 1/2004 | Miyake | 313/501 |
| 2006/0017375 | A1 | 1/2006 | Noguchi et al. | |
| 2008/0122351 | A1 | 5/2008 | Kitazume | |
| 2008/0218068 | A1 * | 9/2008 | Cok | 313/505 |
| 2009/0079328 | A1 * | 3/2009 | Fedorovskaya et al. | 313/504 |
| 2009/0278454 | A1 * | 11/2009 | Fedorovskaya et al. | 313/512 |

FOREIGN PATENT DOCUMENTS

| | | |
|---|---|---|
| CN | 101055921 A | 10/2001 |
| CN | 101055921 | 10/2007 |

OTHER PUBLICATIONS

First Chinese Office Action: Appln. 2009100767756; dated Nov. 26, 2011.

* cited by examiner

*Primary Examiner* — Mark Tornow
(74) *Attorney, Agent, or Firm* — Ladas & Parry LLP

(57) ABSTRACT

An organic light emitting diode (OLED) and a manufacturing method thereof are provided. The OLED includes a substrate, and a first electrode serving as an anode, an organic material layer, a second electrode serving as a cathode, and a sealing layer are formed on the substrate in sequence, and the second electrode is a composite transparent structure layer realizing light emission at the top portion. By forming the composite transparent cathode with a light-transmissive top portion, the OLED emits lights from the top portion, so as to effectively enhance a light utilization ratio and a light transmission ratio, and thus not only an aperture ratio of a display screen is enhanced, but also an excellent displaying effect is obtained. Meanwhile, by adding a mesh-shaped current collection layer on a high-resistance semi-transparent metal layer, a current conducting capability is enhanced while ensuring a high light transmission ratio, thereby effectively satisfying the demands for the top-emitting OLED, which is applicable to a double-sided display device. The OLED has a simple structure and simple and reliable manufacturing technique, which thus has a wide application prospect.

4 Claims, 2 Drawing Sheets

ORGANIC LIGHT EMITTING DIODE AND MANUFACTURING METHOD THEREOF

CROSS-REFERENCE TO RELATED APPLICATIONS

This application claims priority to Chinese Patent Application No. 200910076775.6, filed on Jan. 20, 2009, entitled "ORGANIC LIGHT EMITTING DIODE AND MANUFACTURING METHOD THEREOF", which is incorporated herein by reference in its entirety.

FIELD OF THE TECHNOLOGY

The present invention relates to a flat panel display device and a manufacturing method thereof, and more particularly to an organic light emitting diode (OLED) and a manufacturing method thereof.

BACKGROUND

An OLED is a novel flat panel display device, which has many advantages of actively emitting lights, and having a high brightness, ultra thinness, low power consumption, wide viewing angle, wide range of working temperatures, and the like.

The OLED is a multi-layer thin film laminated structure, in which several organic material layers are sandwiched between a pair of electrodes. When an appropriate voltage is applied, electrons and holes are injected from the corresponding electrodes into the organic material layers, and the electrons and the holes are encountered and captured at corresponding positions during transmission, release energies, and emit lights. A total thickness of the multi-layer thin film laminated structure is usually several micrometers or even smaller, such that the OLED is usually manufactured on a substrate with a certain thickness. The commonly adopted substrate is glass, and when a bottom electrode is a transparent material, light rays may be emitted from the substrate on the side of the bottom electrode, and in this case, a light transmission ratio of a top electrode is not urgently required.

When the OLED is utilized in the displaying application, in one structure, several device units are arranged as a display screen having a matrix structure, in which positive electrodes of each column are connected, and negative electrodes of each row are connected, so as to achieve a dynamic displaying effect through row scanning and column scanning. The OLED is a current-type device, and the brightness thereof nearly has a linear relation with the current. It is assumed that a driving signal scans from left to right, when a bottom right end on the screen intends to obtain the brightness the same as that of a top left end on the screen, the bottom right end needs a much larger voltage. Thus, as for a display screen having hundreds of rows and columns, it is difficult for such a display screen structure to realize a high-resolution displaying effect.

Therefore, in the prior art, another display screen adopting thin film transistors (TFTs) is proposed. The TFT is disposed in each pixel unit to control ON/OFF of the current, and a current (line) layer having a sufficient small resistance is disposed, such that each pixel in the display screen is enabled to obtain the same driving current, thereby realizing the high-resolution displaying effect. However, the TFTs in the display screen with such a structure occupy a large part of the projection area of the pixel units, and the TFTs have a quite low light transmission ratio and are almost opaque, such that the light transmission ratio of the display screen with such a structure is rather low, and has a low aperture ratio. Although the aperture ratio of the display screen may be appropriately increased by reducing an area of the TFTs, an area of the pixel units is quite small, such that the reduction of the area of the TFTs further increases the difficulty in the manufacturing technique.

SUMMARY

Accordingly, the present invention is directed to an OLED and a manufacturing method thereof, which are applicable to effectively eliminate a defect that an aperture ratio of a high resolution display screen is rather low in the prior art, thereby not only having a higher aperture ratio of a display screen, but also having a higher current conducting capability.

In order to achieve the above objective, the present invention provides an OLED, which includes a substrate, and a first electrode serving as an anode, an organic material layer, a second electrode serving as a cathode, and a sealing layer are formed on the substrate in sequence, and the second electrode is a composite transparent structure layer realizing light emission at a top portion.

The composite transparent structure layer includes a semi-transparent metal layer and a current collection layer, the semi-transparent metal layer is formed on the organic material layer, and the current collection layer is formed on the semi-transparent metal layer and is a mesh structure, and mesh lines of the current collection layer are formed at gap positions among pixel units determined by the organic material layer. Furthermore, a height of the mesh lines is smaller than 1 micrometer.

The semi-transparent metal layer is made of Al, Ag, or an NiAu alloy material, and the current collection layer is made of a metal material, a conductive thin film material, or an organic conductive material. Furthermore, the metal material is Al, Ag, Mg, Mo, Cr, an AlMg alloy, or an AlMo alloy, the conductive thin film material is indium tin oxide (ITO) or zinc tin oxide (ZTO), and the organic conductive material is pentacene.

On the basis of the above technical solution, the composite transparent structure layer further includes an optical anti-reflection layer formed on the current collection layer. Furthermore, a thickness of the optical anti-reflection layer is greater than the height of the mesh lines.

In order to realize the above objective, the present invention provides a method for manufacturing an OLED, which includes the following steps.

In Step 1, a first electrode serving as an anode is formed on a substrate by using magnetron sputtering, vacuum thermal evaporation (VTE) or chemical vapor deposition (CVD).

In Step 2, an organic material layer is formed on the substrate after finishing Step 1 by using the VTE, spin coating or spray.

In Step 3, a second electrode serving as a cathode is formed on the substrate after finishing Step 2, in which the second electrode is a composite transparent structure layer realizing light emission at a top portion.

In Step 4, a sealing layer is formed on the substrate after finishing Step 3 by using the CVD, spin coating or spray coating.

The forming the second electrode serving as the cathode in Step 3 further includes the following steps.

A semi-transparent metal layer is formed on the organic material layer by using the VTE.

A current collection layer is formed on the semi-transparent metal layer by using the VTE, imprinting, laser transfer printing, or laser etching, in which the current collection layer is a mesh structure adapted to enhance a current conducting capability, and mesh lines of the current collection layer are located at gap positions among pixel units determined by the organic material layer.

The forming the second electrode serving as the cathode in Step 3 further includes forming an optical anti-reflection layer on the current collection layer by using the VTE, spin coating, or CVD, such that the optical anti-reflection layer fill in spaces enclosed with the mesh lines of the current collection layer and completely covers the current collection layer.

The present invention provides an OLED and a method thereof. By forming the composite transparent cathode with a light-transmissive top portion, the OLED emits lights from the top portion, so as to effectively eliminate the defect of the prior art that an aperture ratio of a high resolution display screen is rather low and effectively enhance a light utilization ratio and a light transmission ratio. Thus, not only an aperture ratio of a display screen is enhanced, but also an excellent displaying effect is obtained. Meanwhile, by adding a mesh-shaped current collection layer on a high-resistance semi-transparent metal layer, a current conducting capability is enhanced while ensuring a high light transmission ratio, thereby effectively satisfying the demands for the top-emitting OLED, which is applicable to a double-sided display device. The OLED of the present invention has a simple structure and simple and reliable manufacturing technique, which thus has a wide application prospect.

| 1-substrate | 2-first electrode | 3-organic material layer |
| --- | --- | --- |
| 4-second electrode | 5-sealing layer | 41-semi-transparent metal layer |
| 42-current collection layer | 43-optical anti-reflection layer | |

DETAILED DESCRIPTION

Technical solutions of the present invention are further described below with reference to the accompanying drawings and embodiments.

Figure 1:
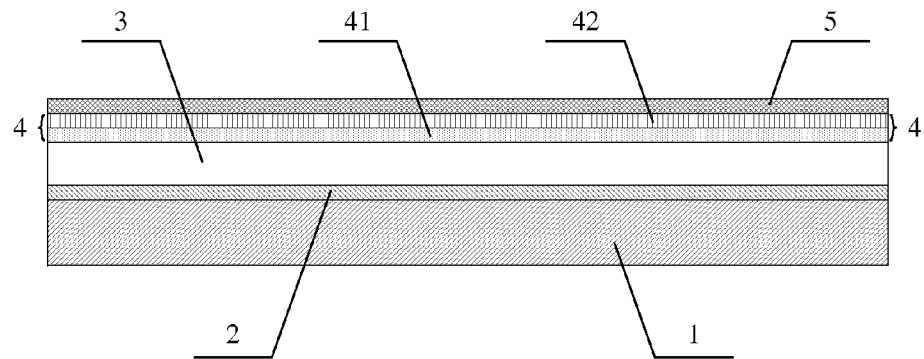
FIG. 1 is a schematic structural view of a first embodiment of an OLED according to the present invention.

FIG. 1 is a schematic structural view of a first embodiment of an OLED according to the present invention. Referring to FIG. 1, a main structure of the OLED of this embodiment includes a first electrode 2, an organic material layer 3, a second electrode 4, and a sealing layer 5 formed on a substrate 1 in sequence, in which the first electrode 2 serves as an anode, the second electrode 4 serves as a cathode and is a composite transparent structure, the organic material layer 3 is disposed between the first electrode 2 serving as the anode and the second electrode 4 serving as the cathode, and the sealing layer 5 is disposed on an outer side of the second electrode 4 and is adapted to delay the decay of the second electrode 4 and the organic material layer 3 due to the influence of an environment. In practical use, the substrate 1 may be a metal substrate, a glass substrate, a ceramic substrate, or a substrate disposed with TFTs usually adopted by persons skilled in the art, in which the metal may be stainless steel, copper, and the like, and the glass my be alkali glass, quartz glass, and the like. The first electrode 2 serving as the anode may be metal, alloy, metal oxide, or other materials, and may be prepared by using magnetron sputtering, VTE, CVD, or other manners. The organic material layer 3 may be a single layer, or a composite layer formed by a plurality of layers, in which each layer is made of a single material or a mixture of a plurality of materials. The organic material layer 3 may be made of a small molecular material, a high molecular material, a metal chelate, or a mixture thereof. The organic material layer 3 may be prepared by using VTE, spin coating, spray, or other manners. The sealing layer 5 may be made of an organic material, an inorganic material, or a mixture thereof. The sealing layer 5 may be prepared by using CVD, spin coating, spray coating, or other manners.

Figure 2:
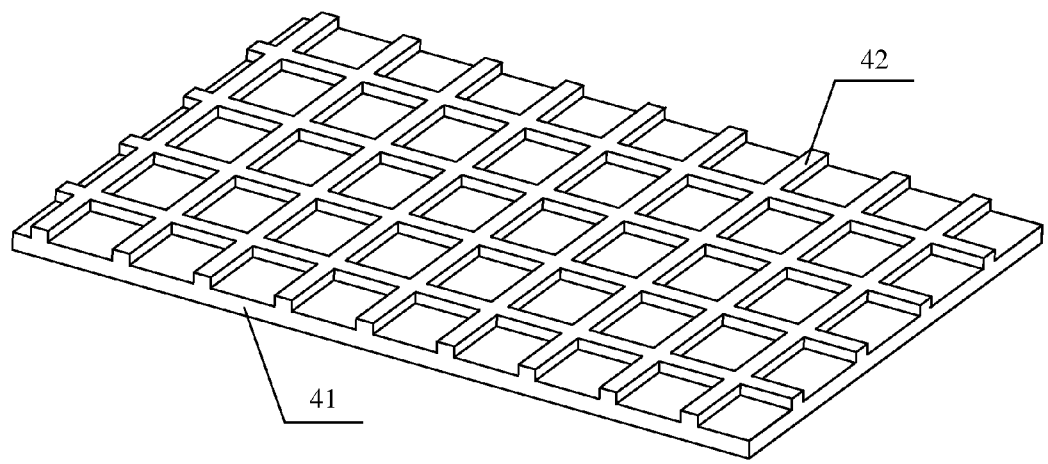
FIG. 2 is a schematic structural view of a second electrode according to the first embodiment of the present invention.

FIG. 2 is a schematic structural view of a second electrode according to the first embodiment of the present invention. Referring to FIG. 2, in this embodiment, the second electrode 4 having the composite transparent structure includes a semi-transparent metal layer 41 and a current collection layer 42. The semi-transparent metal layer 41 is formed on the organic material layer 3, and is adapted to enable the second electrode 4 to have a desirable light transmission ratio, such that the OLED of this embodiment emits lights at a top portion. The current collection layer 42 is formed on the semi-transparent metal layer 41, and is a mesh structure adapted to enhance a current conducting capability, that is, mesh lines are formed to be protruded from a surface of the organic material layer 3, and the mesh lines are located at gap positions among pixel units determined by the organic material layer 3, that is, the mesh lines are located at non-light-emitting regions among the pixel units. During practical application, the semi-transparent metal layer 41 of this embodiment may be made of Al, Ag, an NiAu alloy, and the like, and is prepared by using the VTE or other manners. The current collection layer 42 may be made of a metal material, a conductive thin film material, or an organic conductive material, in which the metal material may be Al, Ag, Mg, Mo, Cr, an AlMg alloy, or an AlMo alloy, the conductive thin film material may be ITO or ZTO, and the organic conductive material may be pentacene. The current collection layer 42 may be prepared by using the VTE, imprinting, laser transfer printing, laser etching, or other manners. Furthermore, meshes of the current collection layer 42 may be uniform or non-uniform and the size of the meshes may be designed according to practical demands. Preferably, a height of the mesh lines is smaller than 1 µm.

Figure 3:
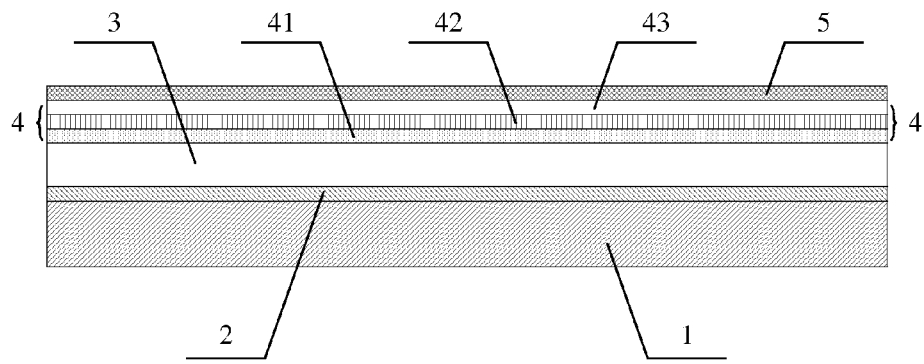
FIG. 3 is a schematic structural view of a second embodiment of an OLED according to the present invention.
Figure 4:
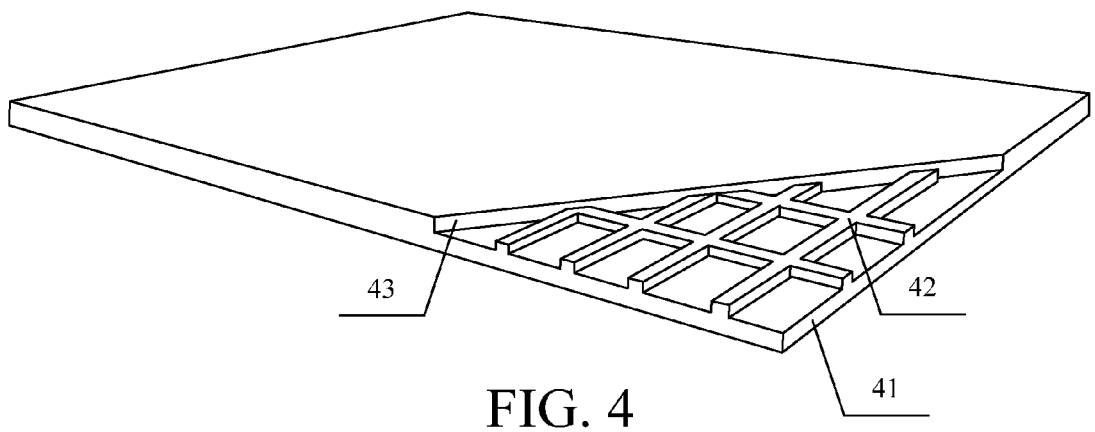
FIG. 4 is a schematic structural view of a second electrode according to the second embodiment of the present invention.

FIG. 3 is a schematic structural view of a second embodiment of an OLED according to the present invention, and FIG. 4 is a schematic structural view of a second electrode according to the second embodiment of the present invention. Referring to FIGS. 3 and 4, a main structure of the OLED of this embodiment includes a first electrode 2, an organic material layer 3, a second electrode 4, and a sealing layer 5 formed on a substrate 1 in sequence. Structures and materials of the substrate 1, the first electrode 2, the organic material layer 3, and the sealing layer 5 are the same as that of the first embodiment, and the difference between the second embodiment and the first embodiment is that the second electrode having a composite transparent structure of this embodiment includes a semi-transparent metal layer 41, a current collection layer 42, and an optical anti-reflection layer 43. The optical anti-reflection layer 43 is formed on the current collection layer 42. Structures and materials of the semi-transparent metal layer 41 and the current collection layer 42 are the same as that of the first embodiment. The optical anti-reflection layer 43 is a transparent material layer having a refraction index being greater than 1, and the optical anti-reflection layer 43 may adopt a conductive material or a non-conductive material, and a thickness thereof is greater than a height of mesh lines, that is, the optical anti-reflection layer 43 fill in spaces enclosed with the mesh lines of the current collection layer 42 and completely covers the current collection layer 42. The optical anti-reflection layer 43 may be prepared by using VTE, spin coating, CVD, or other manners.

Figure 5:
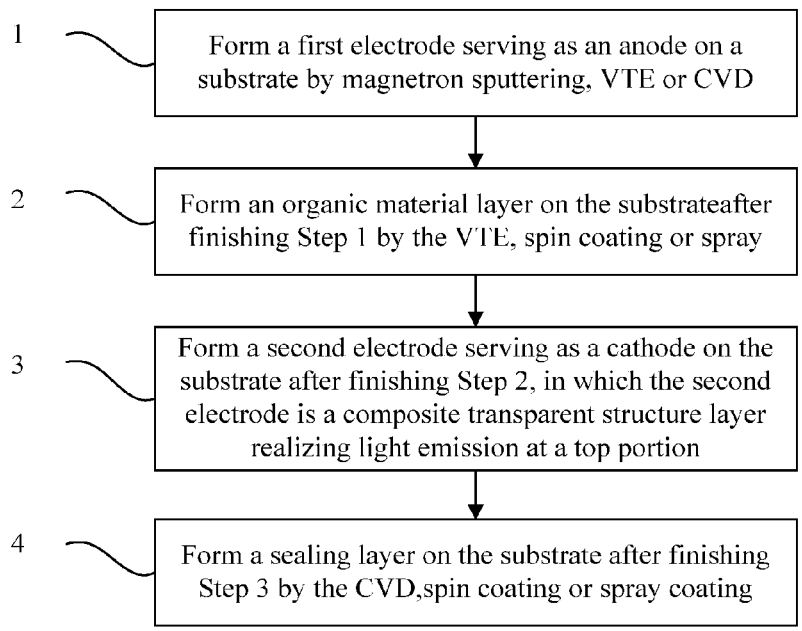
FIG. 5 is a flow chart of a method for manufacturing an OLED according to the present invention.

FIG. 5 is a flow chart of a method for manufacturing an OLED according to the present invention. The method includes the following steps.

In Step 1, a first electrode serving as an anode is formed on a substrate by using magnetron sputtering, VTE or CVD.

In Step 2, an organic material layer is formed on the substrate after finishing Step 1 by using the VTE, spin coating or spray.

In Step 3, a second electrode serving as a cathode is formed on the substrate after finishing Step 2, in which the second electrode is a composite transparent structure layer realizing light emission at a top portion.

In Step 4, a sealing layer is formed on the substrate after finishing Step 3 by using the CVD, spin coating or spray coating.

In Step 1, the substrate 1 may be a metal substrate, a glass substrate, a ceramic substrate, or a substrate disposed with TFTs usually adopted by persons skilled in the art, in which the metal may be stainless steel, copper, and the like, and the glass may be alkali glass, quartz glass, and the like. The first electrode serving as the anode may be metal, alloy, metal oxide, or other materials, and may be prepared by using magnetron sputtering, VTE, CVD, or other manners.

In Step 2, the organic material layer may be a single layer, or a composite layer formed by a plurality of layers, in which each layer is made of a single material or a mixture of a plurality of materials. The organic material layer may be made of a small molecular material, a high molecular material, a metal chelate, or a mixture thereof. The organic material layer may be prepared by using VTE, spin coating, spray, or other manners.

In Step 3, the second electrode having the composite transparent structure includes a semi-transparent metal layer and a current collection layer. The semi-transparent metal layer is formed on the organic material layer, and is adapted to enable the second electrode to have a desirable light transmission ratio, such that the OLED of this embodiment emits lights at a top portion. The current collection layer is formed on the semi-transparent metal layer, and is a mesh structure adapted to enhance a current conducting capability, that is, mesh lines are formed to be protruded from a surface of the organic material layer, and the mesh lines are located at gap positions among pixel units determined by the organic material layer, that is, the mesh lines are located at non-light-emitting regions among the pixel units. During practical application, the semi-transparent metal layer may be made of Al, Ag, an NiAu alloy, and the like, and is prepared by using the VTE or other manners. The current collection layer may be made of a metal material, a conductive thin film material, or an organic conductive material, in which the metal material may be Al, Ag, Mg, Mo, Cr, an AlMg alloy, or an AlMo alloy, the conductive thin film material may be ITO or ZTO, and the organic conductive material may be pentacene. The current collection layer may be prepared by using the VTE, imprinting, laser transfer printing, laser etching, or other manners. Furthermore, meshes of the current collection layer may be uniform or non-uniform and the size of the meshes may be designed according to practical demands. Preferably, a height of the mesh lines is smaller than 1 μm.

Based on the technical solution of Step 3, the second electrode having the composite transparent structure further includes an optical anti-reflection layer. The optical anti-reflection layer is a transparent material layer having a refraction index being greater than 1, the optical anti-reflection layer may adopt a conductive material or a non-conductive material, and a thickness thereof is greater than the height of the mesh lines, that is, the optical anti-reflection layer fill in spaces enclosed with the mesh lines of the current collection layer and completely covers the current collection layer. The optical anti-reflection layer may be prepared by using VTE, spin coating, CVD, or other manners.

In Step 4, the sealing layer may be made of an organic material, an inorganic material, or a mixture thereof. The sealing layer may be prepared by using CVD, spin coating, spray coating, or other manners.

Finally, it should be understood that the above embodiments are only used to explain, but not to limit the technical solution of the present invention. In despite of the detailed description of the present invention with referring to above preferred embodiments, it should be understood that various modifications, changes or equivalent replacements can be made by those skilled in the art without departing from the spirit and scope of the present invention and covered in the claims of the present invention.

What is claimed is:

1. An organic light emitting diode (OLED), comprising a substrate,
   wherein a first electrode serving as an anode, an organic material layer, a second electrode serving as a cathode and a sealing layer are formed on the substrate in sequence, and
   the second electrode is a composite transparent structure layer realizing light emission at a top portion, and
   wherein the composite transparent structure layer comprises a semi-transparent metal layer and a current collection layer, the semi-transparent metal layer is formed on the organic material layer, the current collection layer is formed on the semi-transparent metal layer and is a mesh structure, and mesh lines of the current collection layer are formed at gap positions among pixel units determined by the organic material layer;
   wherein the composite transparent structure layer further comprises an optical anti-reflection layer formed on the current collection layer; and
   wherein a thickness of the optical anti-reflection layer is greater than a height of the mesh lines over the entire width of the substrate, and the optical anti-reflection layer fills in spaces enclosed with the mesh lines of the current collection layer and covers the current collection layer to form a substantially flat surface over the entire width of the substrate.

2. The OLED according to claim 1, wherein a height of the mesh lines is smaller than 1 micrometer.

3. The OLED according to claim 1, wherein the semi-transparent metal layer is made of Al, Ag or an NiAu alloy material, and the current collection layer is made of a metal material, a conductive thin film material or an organic conductive material.

4. The OLED according to claim 3, wherein the metal material is Al, Ag, Mg, Mo, Cr, an AlMg alloy or an AlMo alloy, the conductive thin film material is indium tin oxide (ITO) or zinc tin oxide (ZTO), and the organic conductive material is pentacene.

* * * * *